United States Patent
Saini et al.

(10) Patent No.: US 7,081,630 B2
(45) Date of Patent: Jul. 25, 2006

(54) COMPACT MICROCOLUMN FOR AUTOMATED ASSEMBLY

(75) Inventors: Rahul Saini, Dallas, TX (US); Zoran Jandric, Dallas, TX (US)

(73) Assignee: Zyvex Corporation, Richardson, TX (US)

( * ) Notice: Subject to any disclaimer, the term of this patent is extended or adjusted under 35 U.S.C. 154(b) by 58 days.

(21) Appl. No.: 10/799,836

(22) Filed: Mar. 12, 2004

(65) Prior Publication Data

US 2005/0199821 A1 Sep. 15, 2005

(51) Int. Cl.
*G01K 1/08* (2006.01)
*H01J 3/14* (2006.01)
*H01J 3/26* (2006.01)
*H01L 21/44* (2006.01)
*H05K 1/00* (2006.01)

(52) U.S. Cl. .................. 250/398; 438/598; 439/55

(58) Field of Classification Search .............. 206/87; 702/85; 715/837; 438/598, 50, 51; 403/327, 403/329; 24/625, 453, 455; 250/398
See application file for complete search history.

(56) References Cited

U.S. PATENT DOCUMENTS

| | | | |
|---|---|---|---|
| 4,963,748 A | 10/1990 | Szilagyi | |
| 5,122,663 A | 6/1992 | Chang et al. | |
| 5,963,788 A | 10/1999 | Barron et al. | |
| 6,103,399 A | 8/2000 | Smela et al. | |
| 6,219,254 B1 | 4/2001 | Akerling et al. | |
| 6,300,156 B1 | 10/2001 | Decker et al. | |

(Continued)

OTHER PUBLICATIONS

Muray et al., "Advances in Arrayed Microcolumn Lithography", Journal of Vacuum Science and Technology. B, Microelectronics and Nanometer Structures Processing, Measurement and Phenomena: An Official Publication of the American Vacuum Society, vol. 18 (6), Nov./Dec. 2000, pp. 3099-3104. (IRN10495228).

Dechev et al., "Microassembly of 3-D Microstructure Using a Compliant, Passive Microgripper," Journal of Microelectromechanical Systems, vol. 13, No. 2, Apr. 2004, pp. 176-189.

Tsui et al., "Micromachined end-effort and techniques for directed MEMS assembly," Journal of Micromechanics and Microengineering, Institute of Physics Publishing, United Kingdom 2004, pp. 1-8.

Ellis, et al., "High aspect ratio silicon micromechanical connectors", High Aspect Ratio Micro-Structure Technology Workshop, Jun. 15-17, 2003, Monterey, California USA.

M. Szilagyi et al., "Synthesis of Electrostatic Focusing and Deflection Systems", JVST B 15(6), Nov./Dec. 1997, pp 1971.

*Primary Examiner*—Nikita Wells
*Assistant Examiner*—Johnnie L Smith, II
(74) *Attorney, Agent, or Firm*—Haynes and Boone, LLP

(57) ABSTRACT

A microcolumn including an assembly substrate and a plurality of beam modification components. The assembly substrate includes a plurality of sockets, and the beam modification components each include a connector coupled to a corresponding one of the sockets. Assembly of the beam modification components to the assembly substrate may employ automation and/or automated calibration, including automated motion of robotic stages in a substantially automated manner.

40 Claims, 9 Drawing Sheets

U.S. PATENT DOCUMENTS

| | | | |
|---|---|---|---|
| 6,396,711 B1 * | 5/2002 | Degani et al. | 361/760 |
| 6,398,280 B1 * | 6/2002 | Parker et al. | 294/86.4 |
| 6,561,725 B1 * | 5/2003 | Ellis et al. | 403/326 |
| 6,672,795 B1 * | 1/2004 | Ellis et al. | 403/327 |
| 6,745,567 B1 | 6/2004 | Mercanzini | |
| 6,762,116 B1 * | 7/2004 | Skidmore | 438/598 |
| 6,881,074 B1 * | 4/2005 | McLenaghan | 439/70 |
| 2002/0125208 A1 | 9/2002 | Christenson et al. | |

* cited by examiner

US 7,081,630 B2

COMPACT MICROCOLUMN FOR AUTOMATED ASSEMBLY

This invention was made with the United States Government support under DARPA contract DAAH01-03-C-R217, Phase 1, SBIR. The United States Government has certain rights in the invention.

CROSS-REFERENCE

This application is related to the commonly-assigned U.S. patent application entitled "MEMS MICROCONNECTORS AND NON-POWERED MICROASSEMBLY THEREWITH," U.S. Application Ser. No. 10/778,460, filed Feb. 13, 2004, having Kenneth Tsui, Aaron Geisberger, and George Skidmore named as inventors.

BACKGROUND

The present disclosure relates generally to electron columns and, more specifically, to compact microcolumns for automated assembly.

Electron beam columns are well known for use in electron microscopy for imaging surfaces and thin samples and for electron beam lithography, such as for imaging a pattern onto a substrate. Conventional electron beam columns for electron microscopy and lithography are typically used to produce a scanning probe or to illuminate a sample or an aperture using a series of electron beam lenses, including magnetic or electrostatic lenses.

A well-known variant, the microcolumn, is a very short and small diameter electron beam column, often used in an array of such columns. Microcolumns are structures including microlenses and deflectors. In general, the microlenses are multiple layers of silicon chips or silicon membranes spaced apart by insulating layers and having bore diameters that vary from a few to several hundred μm. Such microlenses may include a plurality of microlens components or elements, accurately aligned for the purpose of focusing electron beams. Electrodes of the microlenses may include silicon membranes formed from a polished wafer containing a plurality of die, wherein a membrane may be formed at the center of each die, possibly by wet isotropic etching.

Coupling the insulating and microlens silicon layers of the microcolumn is typically achieved by anodic bonding. However, anodic bonding must be conducted at elevated temperatures, which typically requires several hours of heat-up (to approximately 400° C.) and cool-down time, as well as a physical connection of a high voltage probe, during which time drift, bond-induced shift, and expansion can degrade the alignment. This process must then be repeated for each additional layer. Because the apertures in the microlenses must be precisely aligned, assembly of the microcolumn is complex and time-consuming. For example, one assembly method requires each lens to be aligned under an optical microscope and anodically bonded one at a time. In addition, sodium ion migration from insulating layers to conductive layers during operation at elevated voltages can cause arcing and, consequently, failure of the microcolumn.

Accordingly, what is needed in the art is a microcolumn, a method of manufacturing a microcolumn, and a system incorporating a microcolumn, that addresses the above-discussed issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 7B is a detail view of a portion of FIG. 7A.

DETAILED DESCRIPTION

Figure 1:
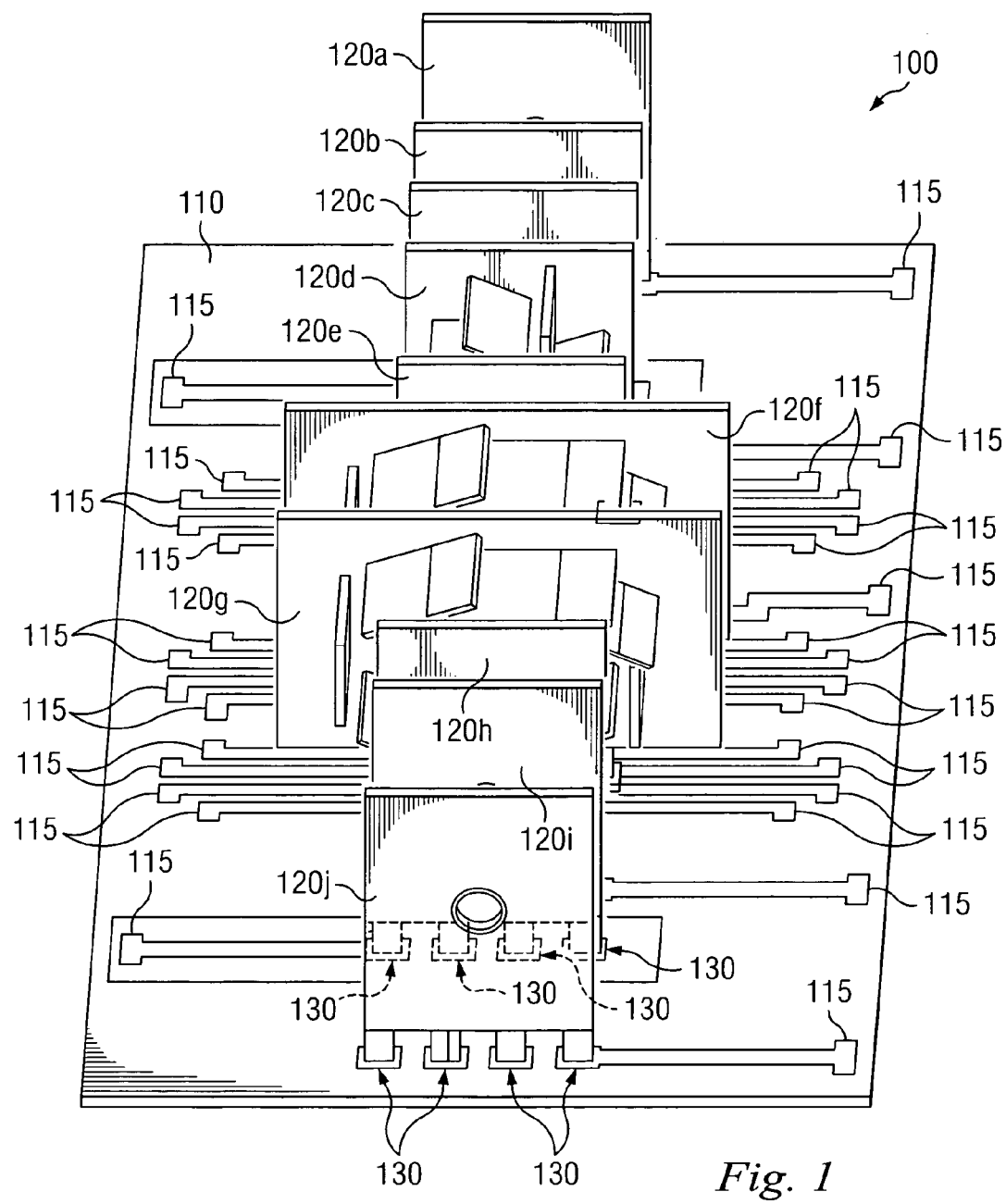
FIG. 1 illustrates a perspective view of one embodiment of a microcolumn constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a perspective view of one embodiment of a scanning electron microscope (SEM) microcolumn 100 according to aspects of the present disclosure. The microcolumn 100 includes an assembly substrate 110 and beam modification components 120a–j coupled to the assembly substrate 110. The beam modification components 120a–j may be coupled to the assembly substrate 110 by adhesive, bonding, soldering, brazing, mechanical clips and other fasteners, combinations thereof, and/or other means.

In one embodiment, the beam modification components 120a–j may be coupled to the assembly substrate 110 by connector/socket pairs, such as those shown in U.S. patent application Ser. No. 10/778,460, filed Feb. 13, 2004, entitled "MEMS MICROCONNECTORS AND NON-POWERED MICROASSEMBLY THEREWITH," having Kenneth Tsui, Aaron Geisberger, and George Skidmore names as inventors, which is incorporated by reference herein in its entirety. For example, each of the beam modification components 120a–j may include an integral connector for engaging a corresponding socket 130 on the assembly substrate 110. The connectors may also be separate components bonded or otherwise coupled to the beam modification components 120a–j. The assembly substrate 110 may also include traces or other conductive members 115 electrically connected to corresponding sockets 130 for providing current and/or biasing signals to the ones of the beam modification components 120a–j.

In the illustrated embodiment, the beam modification components 120a–j include an extractor component 120a, a focusing electrode component 120b, an anode component 120c, an octupole component 120d, an aperture component 120e, deflector components 120f and 120g, and Einzel lens components 120h–j. Of course, embodiments within the scope of the present disclosure are not limited to the assembly shown in FIG. 1. For example, the microcolumn 100 may include additional and/or alternative beam modification components. The number of beam modification components employed in the microcolumn 100 is also not limited by the scope of the present disclosure, such that embodiments may include more or fewer beam modification components than in the illustrated embodiment.

As also shown in FIG. 1, one or more of the beam modification components 120a–j may be oriented substantially perpendicular to the assembly substrate 110 and substantially parallel to each other. However, such an orientation is not required in every embodiment, such that the beam modification components 120a–j may be oriented at acute angles relative to each other and/or to the assembly substrate 110. Moreover, while each of the illustrated beam modification components 120a–j are substantially planar and several have substantially similar footprint profiles and areas, other configurations are within the scope of the present disclosure. In one embodiment, one or more or all of the beam modification components 120a–j have a footprint of less than about 2 cm². For example, a number of the beam modification components 120a–j may have a footprint of about 1 cm².

Figure 2:
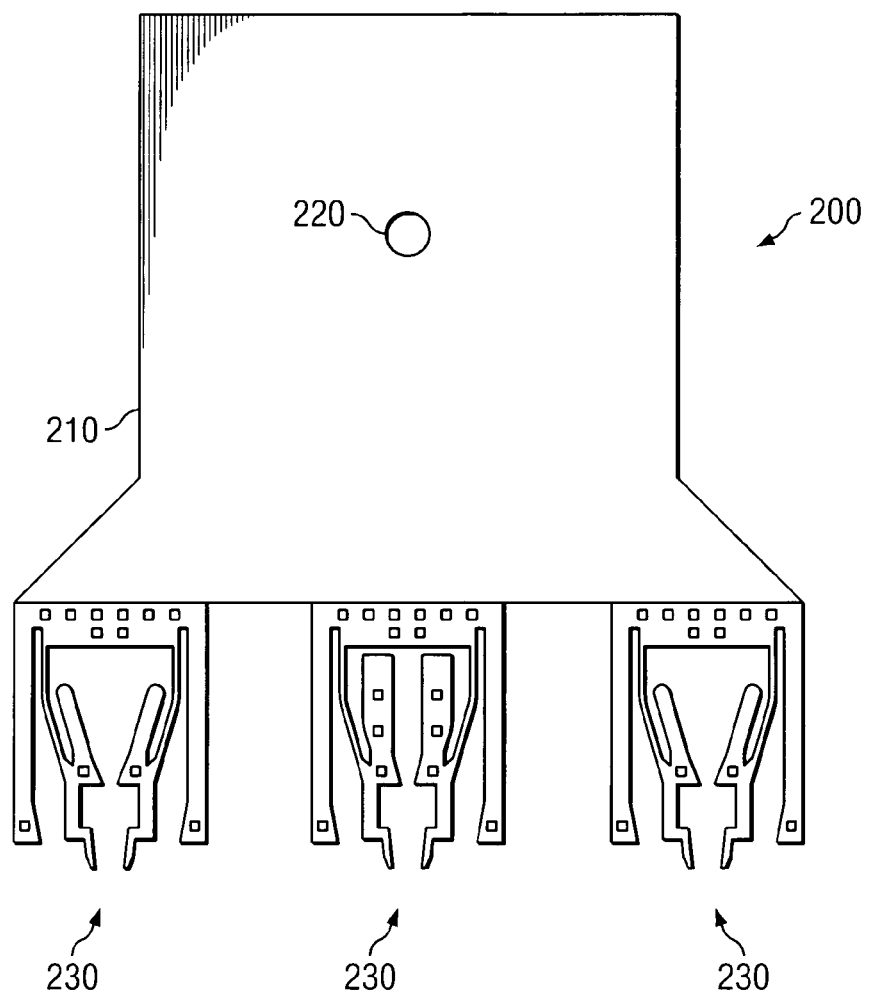
FIG. 2 illustrates a plan view of one embodiment of a beam modification component constructed according to aspects of the present disclosure.

Referring to FIG. 2, illustrated is a plan view of one embodiment of a beam modification component 200 constructed according to aspects of the present disclosure. The beam modification component 200 may be substantially similar to one or more of the beam modification components 120a–j shown in FIG. 1.

The beam modification component 200 includes a component substrate 210 having a through-hole aperture 220. The through-hole aperture 220 may be sized based on the intended purpose of the beam modification component 200. For example, if the beam modification component 200 is to be employed as an extractor component, the aperture 220 may be smaller than the diameter of an incident electron beam. Accordingly, the beam modification component 200 may physically extract, deflect, or otherwise prevent from passing fringe components of an incident electron beam or otherwise reduce the diameter of the electron beam by removing portions of the electron beam. Such a beam modification component 200 may also be employed as a spray aperture component or a blanker component.

Another beam limiting function for which the beam modification component 200 may be employed is setting the beam convergence angle. Optimizing the beam convergence angle, which may be measured as the half-angle of the beam at the target, may control the effect of lens aberrations and resolution, and may also be achieved by appropriately sizing the aperture 220. The size of the aperture 220 may also be sized to set the beam current.

While not limited within the scope of the present application, the diameter of the aperture 220 in the above-described functions may range between about 5 μm and about 1000 μm. Moreover, the aperture 220 may have a substantially circular shape, as shown in FIG. 2, or other shapes. For example, the shape of the aperture 220 may be substantially square, triangular, pentagonal, hexagonal, octagonal, or other polygonal shapes, as well as other irregular shapes.

The beam modification component 200 may also include connectors 230 for coupling the component 200 to corresponding sockets 130 on the assembly substrate 110 shown in FIG. 1. The connectors 230 may be conductive or include conductive members, such that a desired current and/or bias may be passed from the assembly substrate 110 to the beam modification component 200. The component substrate 210 may be conductive, or semiconductive, and may be electrically coupled to the connectors 230 or conductive portions thereof. Accordingly, the beam modification component 200 may be held at a bias potential, such as when the component 200 is employed as a focusing electrode component, an anode component, or an Einzel lens component.

In one embodiment, the beam modification component 200 may be configured to be heated, such as to prevent the formation of contamination deposits. Heat sources employed for such heating may including external or local heaters or lasers. Ohmic heating may also be employed, in which case the beam modification component 200 may include traces or coils.

Figure 3:
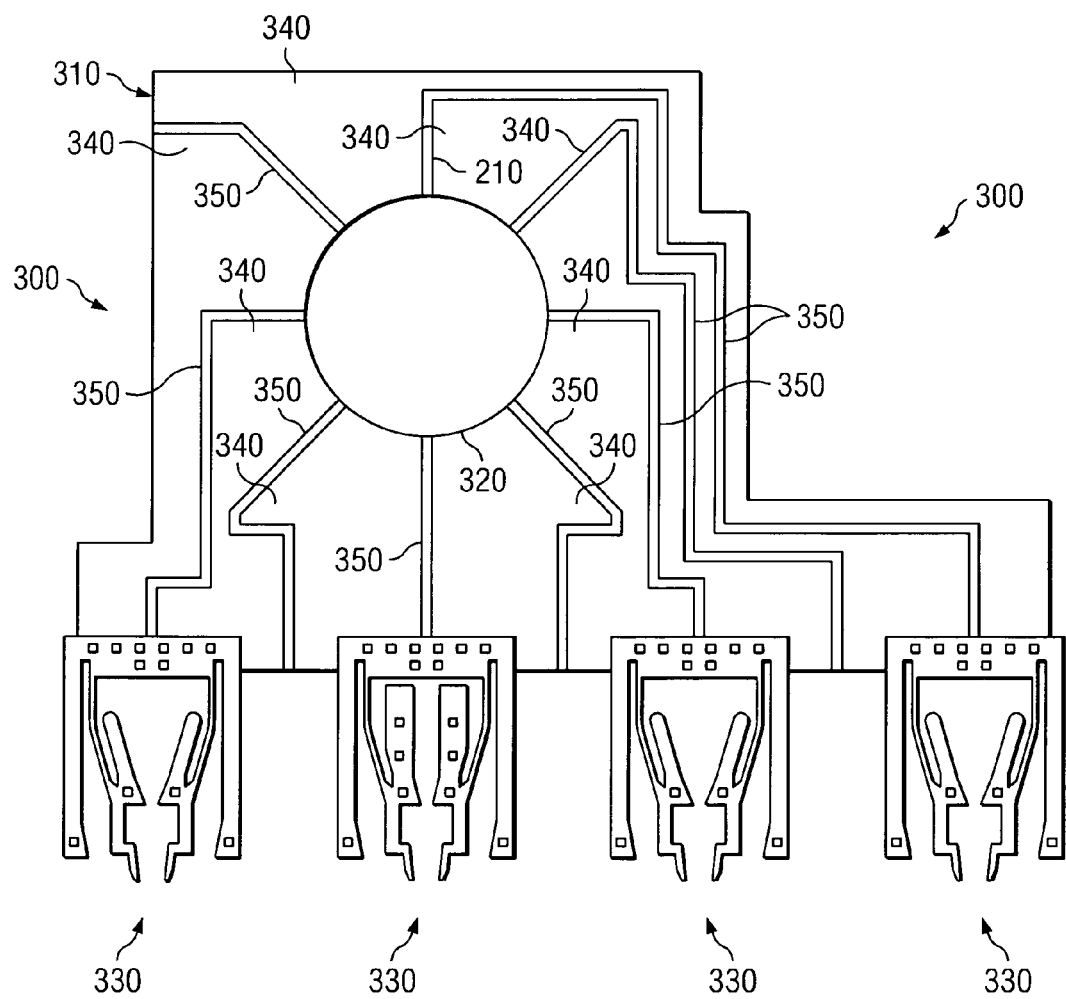
FIG. 3 illustrates a plan view of another embodiment of a beam modification component constructed according to aspects of the present disclosure.

Referring to FIG. 3, illustrated is a plan view of another embodiment of a beam modification component 300 constructed according to aspects of the present disclosure. The beam modification component 300 may be substantially similar to one or more of the beam modification components 120a–j shown in FIG. 1.

The beam modification component 300 includes a component substrate 310 having a through-hole aperture 320. The through-hole aperture 320 may be sized to permit the transmission of all or a substantial portion of an incident electron beam. The beam modification component 300 also includes connectors 330 for coupling to corresponding sockets 130 on the assembly substrate 110 shown in FIG. 1. The connectors 330 may be conductive or include conductive portions, thereby interconnecting traces or conductors 115 on the assembly substrate 110 to corresponding electrodes 340 formed on or integral to the component substrate 310. For example, in the embodiment shown in FIG. 3, the beam modification component 300 includes 8 electrodes 340 and 4 connectors 330 each having two conductors electrically coupled to a corresponding electrode 340. The electrodes 340 may be randomly or regularly distributed about the aperture 320, and may be isolated from one another by trenches 350 filled with nitride, silicon nitride, silicon dioxide, and/or other insulating materials. However, in some embodiments, the beam modification component 300 (and others described herein) may not include such trenches 350.

The beam modification component 300 may be employed as a deflector or a focusing element by biasing the electrodes 340 in a predetermined configuration. For example, the electrodes 340 may be biased at similar potentials to focus an electron beam, or opposing ones of the electrodes 340 may be biased at different potentials to deflect or steer the electron beam. Such focusing and deflection may also be performed simultaneously.

Figure 4:
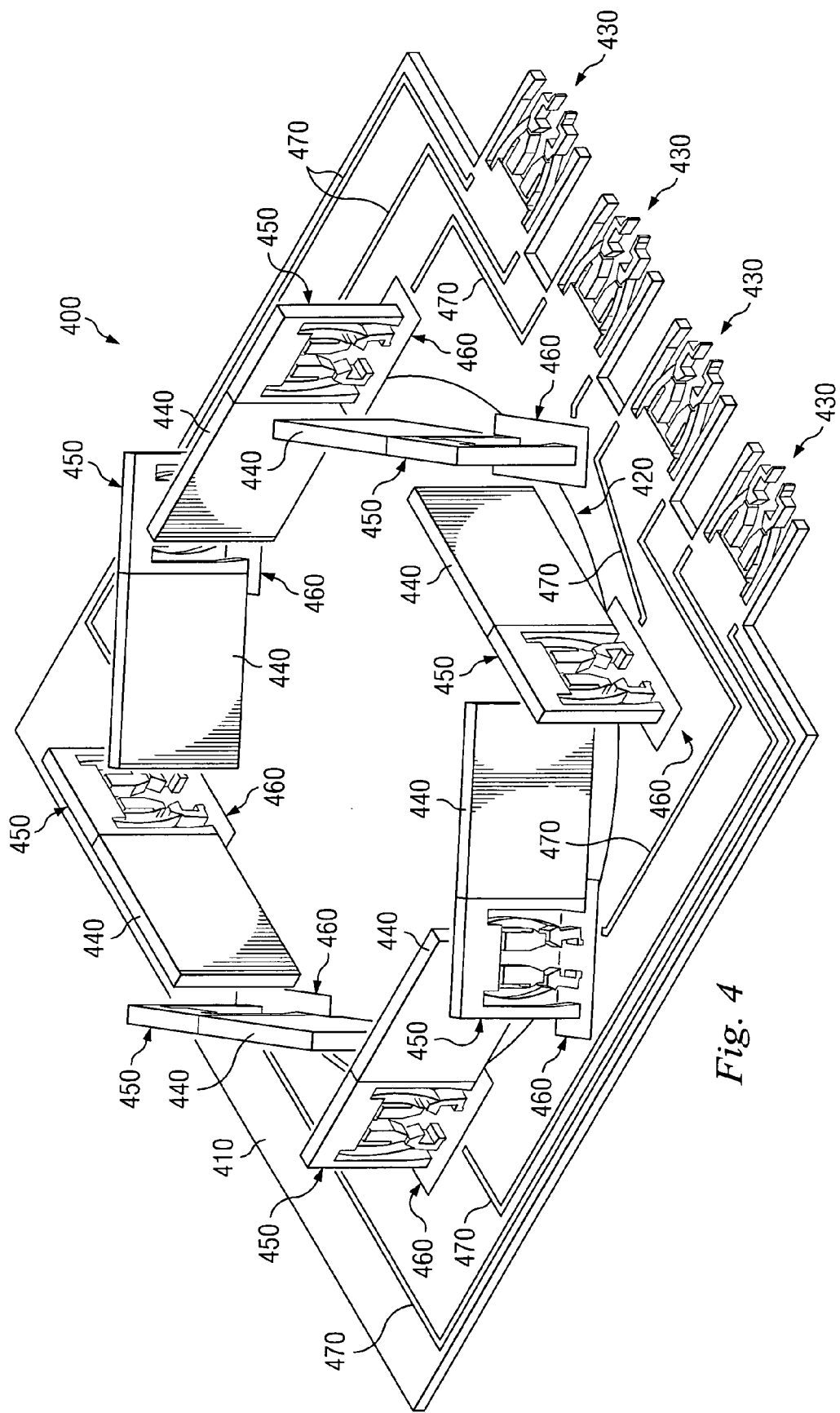
FIG. 4 illustrates a perspective view of another embodiment of a beam modification component constructed according to aspects of the present disclosure.

Referring to FIG. 4, illustrated is a perspective view of another embodiment of a beam modification component 400 constructed according to aspects of the present disclosure. The beam modification component 400 may be substantially similar to one or more of the beam modification components 120a–j shown in FIG. 1.

The beam modification component 400 includes a component substrate 410 having a pass-through aperture 420 and connectors 430 for coupling to corresponding sockets 130 on the assembly substrate 110 shown in FIG. 1. The beam modification component 400 also includes biasing plates or otherwise-shaped members 440 each having a connector 450 for coupling to a corresponding socket 460 on the component substrate 410. The connectors 450 and component sockets 460 may be substantially similar to the connectors 430 and sockets 130. The beam modification component 400 may be configured as an octupole, having 8 biasing plates 440, or a quadrupole, having 4 biasing plates 440. Of course, the number of biasing plates 440 included in each beam modification component 400 is not limited within the scope of the present application.

The component substrate 410 also includes traces 470 to provide conductivity between the sockets 130 on the assembly substrate 110 and the biasing plates 440 via the connectors 430, the component sockets 460, and the biasing plate connectors 450, collectively. Accordingly, the biasing plates 440 may be biased at similar or varying potentials as with the electrodes 340 of the beam modification component 300 shown in FIG. 3.

Figure 5A:
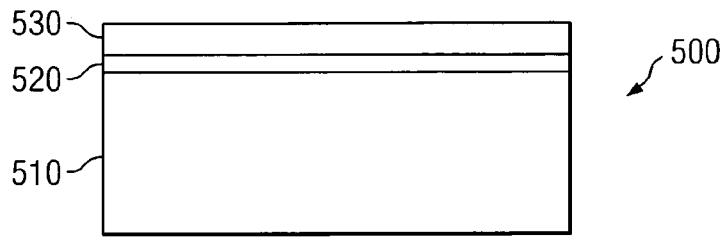
FIGS. 5A–5D illustrate sectional views of sequential stages of one embodiment of a method of manufacturing a microcolumn component according to aspects of the present disclosure.

Referring to FIG. 5A, illustrated is a sectional view of one embodiment of a component or substrate in the microcolumn 100 shown in FIG. 1, herein designated by the reference numeral 500, in an intermediate stage of manufacture according to aspects of the present disclosure. In one embodiment, the manufacturing stage depicted in FIG. 5A may be an initial stage. The manufacturing method contemplated by FIG. 5A and subsequent figures may be employed during the manufacture of the assembly substrate 110 and the beam modification components 120a–j shown in FIG. 1, the beam modification components 200, 300, 400 shown in FIGS. 2–4, respectively, and/or other components included in the microcolumn 100 of FIG. 1.

As shown in FIG. 5A, the component 500 includes a substrate 510 which, at least in one embodiment, may be a silicon-on-insulator (SOI) substrate. An insulating layer 520 may be included in the substrate 510 or may be formed on or over the substrate 510. The insulating layer 520 may comprise silicon dioxide and/or other insulating materials, and may comprise more than one layer. The insulating layer 520 may also be or include a buried oxide layer, such as that formed by implanting oxide ions into the substrate 510. A device layer 530 may also be included in the substrate 510 or may be formed on or over the insulating layer 520. The device layer 530 may comprise silicon, doped polysilicon, and/or other conductive or semiconductive materials, and may comprise more than one layer. The device layer 530 may also comprise an insulator coated with a conductive material. In one embodiment, the device layer 530 may have a thickness of about 50 µm.

Figure 5B:
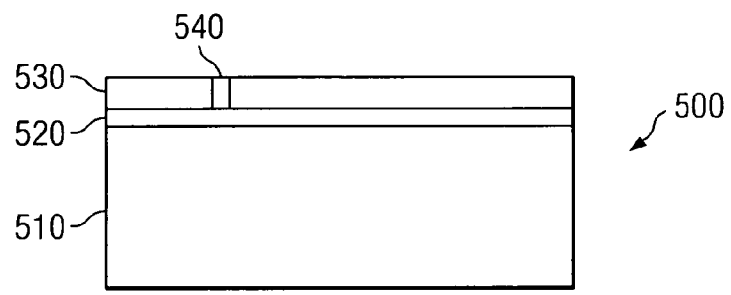

Referring to FIG. 5B, illustrated is a sectional view of the component 500 shown in FIG. 5A in a subsequent stage of manufacture according to aspects of the present disclosure. One or more isolation structures 540 may be formed extending through the device layer 530 to the insulating layer 520 and/or the substrate 510. The isolation structures 540 may be or include shallow trench isolation structures or other features possibly formed by etching recesses or other openings in the device layer 530 and subsequently filling the openings with one or more insulating materials. The isolation structures 540 may comprise nitride, silicon nitride, silicon dioxide, and/or other materials. The isolation structures 540 may be employed to define electrodes on the component 500, such as the electrodes 340 described above in regard to FIG. 3. The isolation structures 540 may also be employed to electrically isolate features formed on the component 500, such as the traces 115 and 470 described above in regard to FIGS. 1 and 4, respectively. In one embodiment, multiple instances of the component 500 may be formed on a single substrate, wafer, chip or die area. For example, the assembly substrate 110 and each of the beam modification components 120a–j, including sub-components thereof, may be formed from or on a common substrate. In such an embodiment, the isolation structures 540 may be employed to electrically isolate each of these components.

Figure 5C:
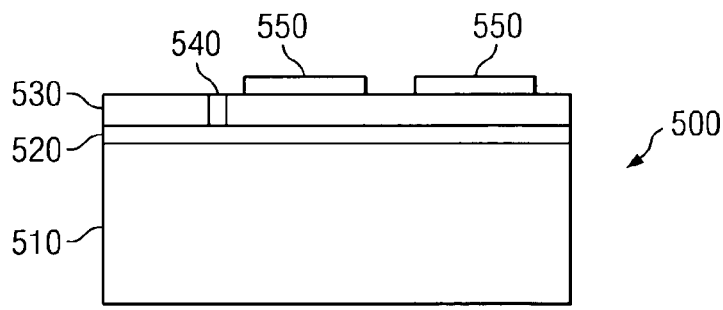

Referring to FIG. 5C, illustrated is a sectional view of the component 500 shown in FIG. 5B in a subsequent stage of manufacture according to aspects of the present disclosure. A conductive layer 550 is formed over the device layer 530, such as by selective deposition or by blanket deposition followed by a patterning process. The conductive layer 550 may comprise gold, platinum, silver, aluminum, doped polysilicon, alloys thereof, and/or other materials. The conductive layer 550 is patterned to form traces and/or electrodes on the device layer, such as the electrodes 340 shown in FIG. 3, the traces 115 on the assembly substrate 110 in FIG. 1, and the traces 470 of the component substrate 410 shown in FIG. 4.

Figure 5D:
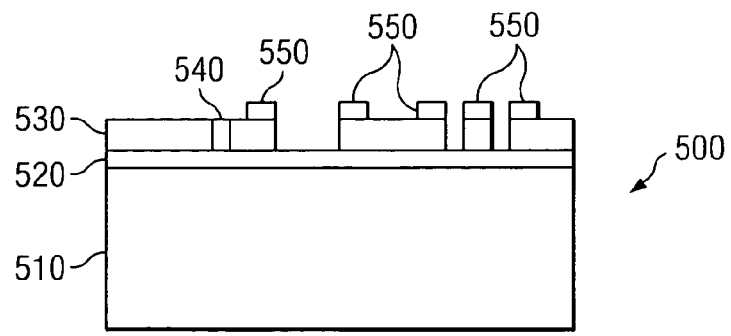

Referring to FIG. 5D, illustrated is a sectional view of the component 500 shown in FIG. 5C in a subsequent stage of manufacture according to aspects of the present disclosure. The device layer 530 and/or the conductive layer 550 are patterned to form connectors and/or sockets, such as the connectors 230, 330, and 430 shown in FIGS. 2, 3, and 4, respectively. The device layer 530 and/or the conductive layer 550 may also be patterned to form traces and/or electrodes on the device layer, such as the electrodes 340 shown in FIG. 3, the traces 115 on the assembly substrate 110 in FIG. 1, and the traces 470 on the component substrate 410 in FIG. 4. The patterning contemplated in FIG. 5D may also be employed to define the component 500 itself, such as the assembly substrate 100 and/or beam modification components 120a–j shown in FIG. 1, and/or the beam modification components 200, 300, and 400 shown in FIGS. 2, 3, and 4, respectively.

In one embodiment, the substrate 510 may be sized such that the assembly substrate and all or a portion of the beam modification components employed in a single microcolumn may be defined in the device layer of a single substrate, wafer, chip, or die. In another embodiment, the assembly substrate and/or the beam modification components may be fabricated from multiple substrates, including those of different compositions. For example, the assembly substrate may be fabricated from a substrate having a nickel layer insulated over a Pyrex bulk layer and one or more of the beam modification components may be fabricated from another type of substrate.

In a subsequent processing step, all or portions of the insulating layer 520 may be removed, such as by one or more wet or dry etching processes. Consequently, at least a portion of the device layer 530 may be "released" from the substrate 510. However, a portion of the device layer 530 may also be tethered to the substrate by a portion or "tether" of the device layer extending between released and non-released portions. Accordingly, the released portion of the device layer 530 may be maintained in a substantially known position to facilitate capture of a released portion of the device layer 530 during a subsequent assembly process.

Figure 6:
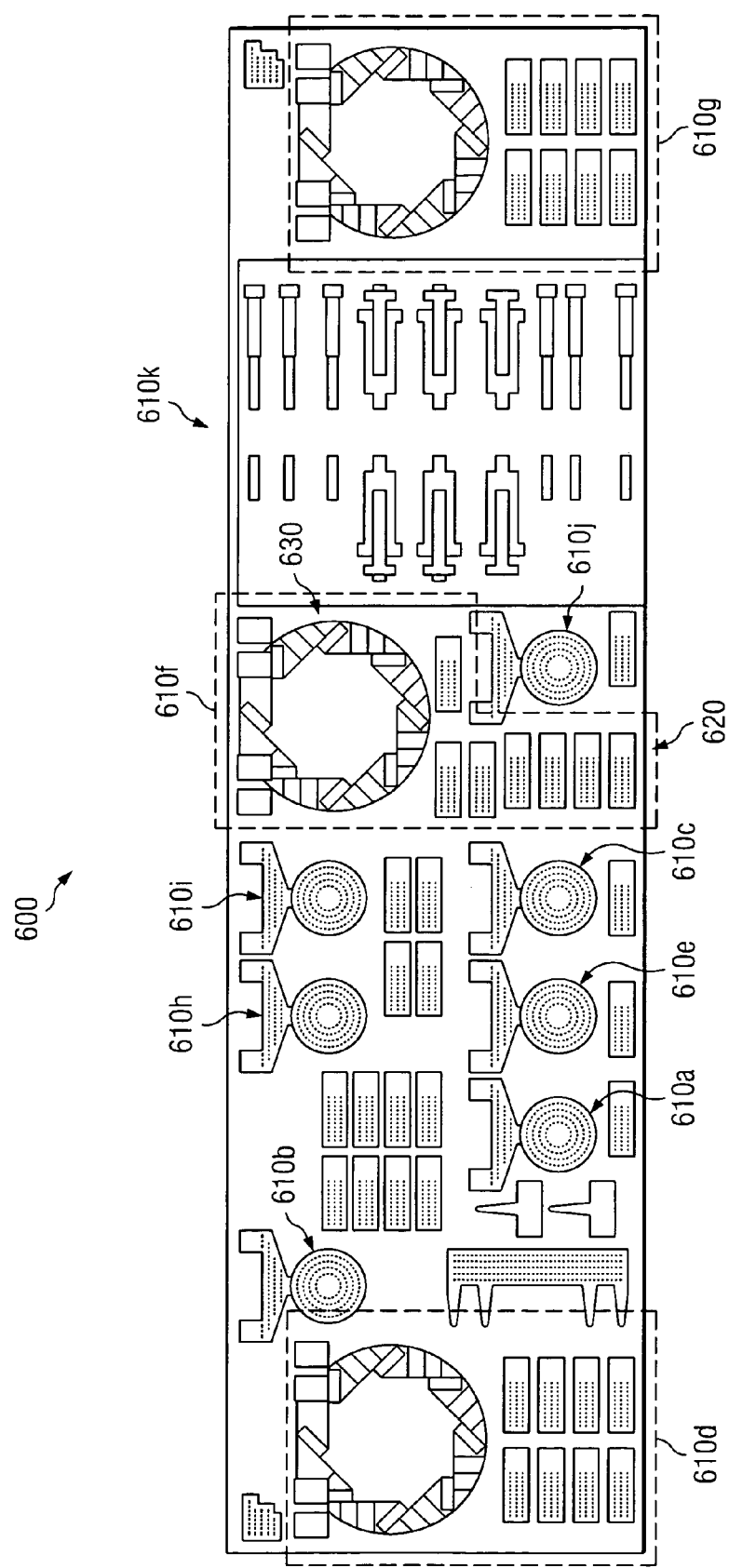
FIG. 6 illustrates a perspective view of one embodiment of a substrate from which a microcolumn may be assembled according to aspects of the present disclosure.

Referring to FIG. 6, illustrated is a perspective view of one embodiment of a substrate 600 having components 610a–k formed thereon to be employed in the assembly of a microcolumn according to aspects of the present disclosure. The microcolumn to be assembled from the components 610a–k may be substantially similar to the microcolumn 100 shown in FIG. 1.

For example, the components 610a–k include an extractor component 610a which may be substantially similar to the extractor component 120a in FIG. 1. The components 610a–k also include a focusing electrode component 610b which may be substantially similar to the focusing electrode component 120b, an anode component 610c which may be substantially similar to the anode component 120c, an octupole component 610d which may be substantially similar to the octupole component 120d, an aperture component 610e which may be substantially similar to the aperture component 120e, deflector components 610f and 610g which may be substantially similar to the deflector components 120f and 120g, and Einzel lens components 610h–j which may be substantially similar to the Einzel lens components 120h–j. The components 610a–k also include assembly substrate 610k, which may be substantially similar to the assembly substrate 110 of FIG. 1.

During one embodiment of an assembly method, the extractor component 610a may be removed from the substrate 600 and assembled to the assembly substrate 610k. Such assembly may be performed by one or methods described in "MEMS MICROCONNECTORS AND NON-POWERED MICROASSEMBLY THEREWITH" incorporated herein. For example, a manipulation probe may be oriented proximate the extractor component 610a such that the manipulation probe and a handle portion of the extractor component 610a may be engaged. A tether portion of the extractor component 610a may then be severed, such as by physically cutting the tether with a probe and/or by lifting the extractor component away from the substrate 600 until the tether is broken, thereby freeing the extractor component 610a from the substrate 600.

Thereafter, the manipulation probe may be rotated, translated, and/or otherwise manipulated to orient the extractor component 610a proximate an assembly location on the assembly substrate 610k. In one example, such orientation of the extractor component 610a may include orienting a connector portion of the extractor component 610a proximate a socket on the assembly substrate 610k. Thereafter, the manipulation probe may be further manipulated such that the connector of the extractor component 610a becomes engaged with the socket on the assembly substrate 610k. Moreover, positioning of the manipulation probe and the de-tethering, orientation, and assembly of the extractor component 610a may be performed by an automated process.

These procedures may be repeated as necessary to assemble the remaining components 610b–j to the assembly substrate 610k. The components 610b–j may be assembled in any order, although in one embodiment they are assembled in the order in which they will be encountered by an electron beam.

The assembly of the octupole component 610d and the deflector components 610f and 610g may be performed by similar procedures. For example, the octupole component 610d may be assembled by first assembling biasing plates 620 to a component substrate 630 and subsequently assembling the component substrate 630 to the assembly substrate 610k. The assembly of the biasing plates 620 may be performed by similar processes employed to assemble the components 610a–j to the assembly substrate 610k, and may be partially or completely automated, as described above.

Robotic stages may be used to assemble the microcolumn components 610a–j to the assembly substrate 610k. In one embodiment, the robotic stages may be controlled using a computer and user interface. For example, a user may develop a scripted program employed to automate the entire assembly process, or a substantial portion thereof, employing the same manipulator probe, connectors and sockets. The program may govern positioning of the manipulation probe, de-tethering, orientation, and assembly of the components. Moreover, by employing multiple manipulator probes, the same program may be employed to assemble more than one component in parallel, possibly yielding multiple microcolumns.

Figure 7A:
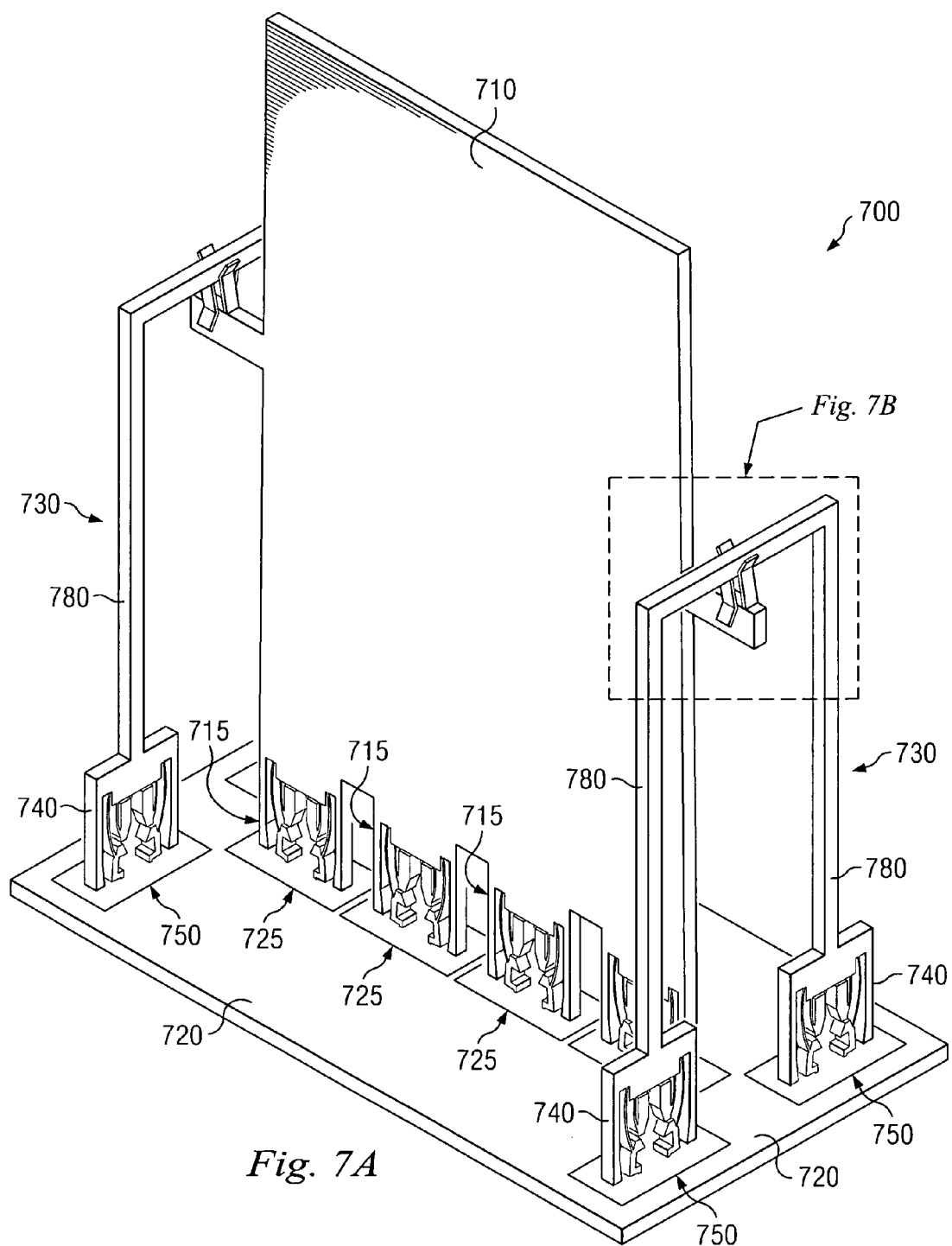
FIGS. 7A and 7B illustrate perspective views of one embodiment of a clamped assembly constructed according to aspects of the present disclosure, whrein
Figure 7B:
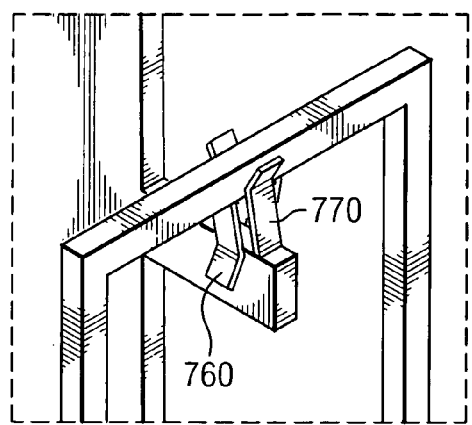

Referring to FIGS. 7A and 7B, collectively, illustrated are perspective views of another embodiment of an assembly 700 of a beam modification component 710 and an assembly substrate 720, wherein FIG. 7B is a detail view of a portion of FIG. 7A. The assembly 700 may be included in the microcolumn 100 of FIG. 1. The beam modification component 710 and the assembly substrate 720 may be substantially similar to any of the beam modification components and assembly substrates described above. The assembly 700 also includes one or more clamp components 730 assembled to the assembly substrate 720 and the beam modification component 710.

Each clamp component 730 includes connectors 740 for engaging corresponding sockets 750 on the assembly substrate 720. The clamp components 730 also include connectors 760 for engaging the beam modification component 710 or connectors 770 thereof. Extensions 780 extend between the connectors 740 and the connectors 760. Each of the connectors 760, 770 may include biasable and/or flexible members for frictionally, pre-stressed, and/or otherwise engaging surfaces of a mating component.

During assembly, the beam modification component 710 may be assembled to the assembly substrate 720, possibly by the assembly procedures described above. Such assembly may include engaging connectors 715 of the beam modification component 710 with sockets 725 of the assembly substrate 720. This assembly may also be automated, as described above. The clamp components 730 may then be assembled individually or simultaneously. During this assembly, the connectors 740 may be engaged with the sockets 750 while the connectors 760 and 770 simultaneously engage.

Figure 8:
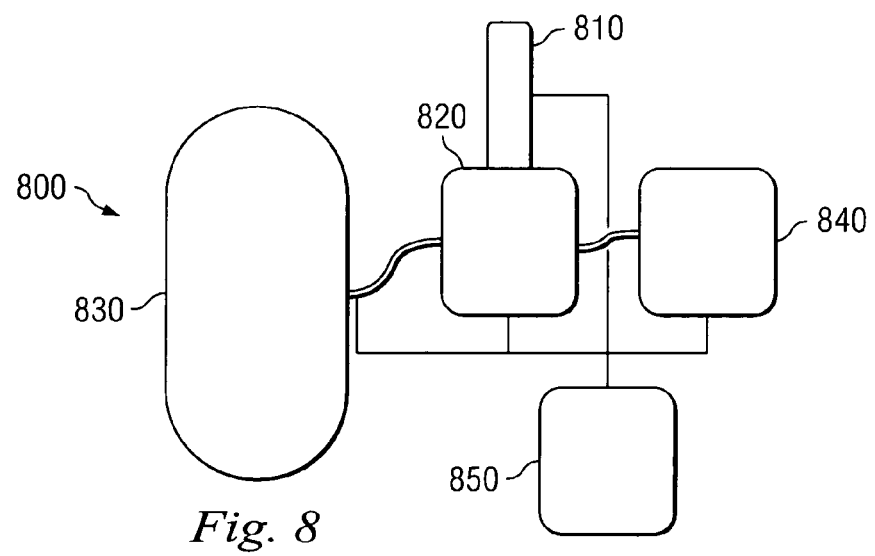
FIG. 8 illustrates a schematic view of one embodiment of a microcolumn system according to aspects of the present disclosure.

Referring to FIG. 8, illustrated is a schematic view of one embodiment of a microcolumn system 800 constructed according to aspects of the present disclosure. The system 800 is one environment in which the microcolumn 100 of FIG. 1 may be implemented. For example, the system 800 includes a column 810 which includes a electron emitter and a microcolumn, wherein the microcolumn may be substantially similar to the microcolumn 100 shown in FIG. 1.

The system 800 also includes a specimen chamber 820 including a stage and/or other means for supporting and possibly orienting a specimen undergoing investigation by the system 800. The specimen chamber 820 may also house detectors and/or other means for detecting affects of the electron beam on a specimen. The detectors may be employed to determined a chemical composition of the specimen, to determine geometries of features of the specimen, or for other functions of the system 800. Thus, the system 800 may be employed for SEM, mass spectroscopy, metrology, e-beam lithography, and/or other investigate processes employing microcolumns and electron or charged ion beams. The specimen chamber 820 may also include still or video imaging means for capturing macroscopic images of the specimen and its orientation in the chamber 820.

The system 800 may also include a tank 830 for holding liquid nitrogen or other coolants which may be employed to cool the detectors in the specimen chamber 820. The system 800 may also include a vacuum system 840 coupled to the chamber 820 for evacuating the chamber 820, including to levels below atmospheric pressure. A controller 850 may be coupled to one or more of the column 810, the chamber 820, the tank 830 or valve thereof, and the vacuum system 840, for controlling operation thereof.

Figure 9:
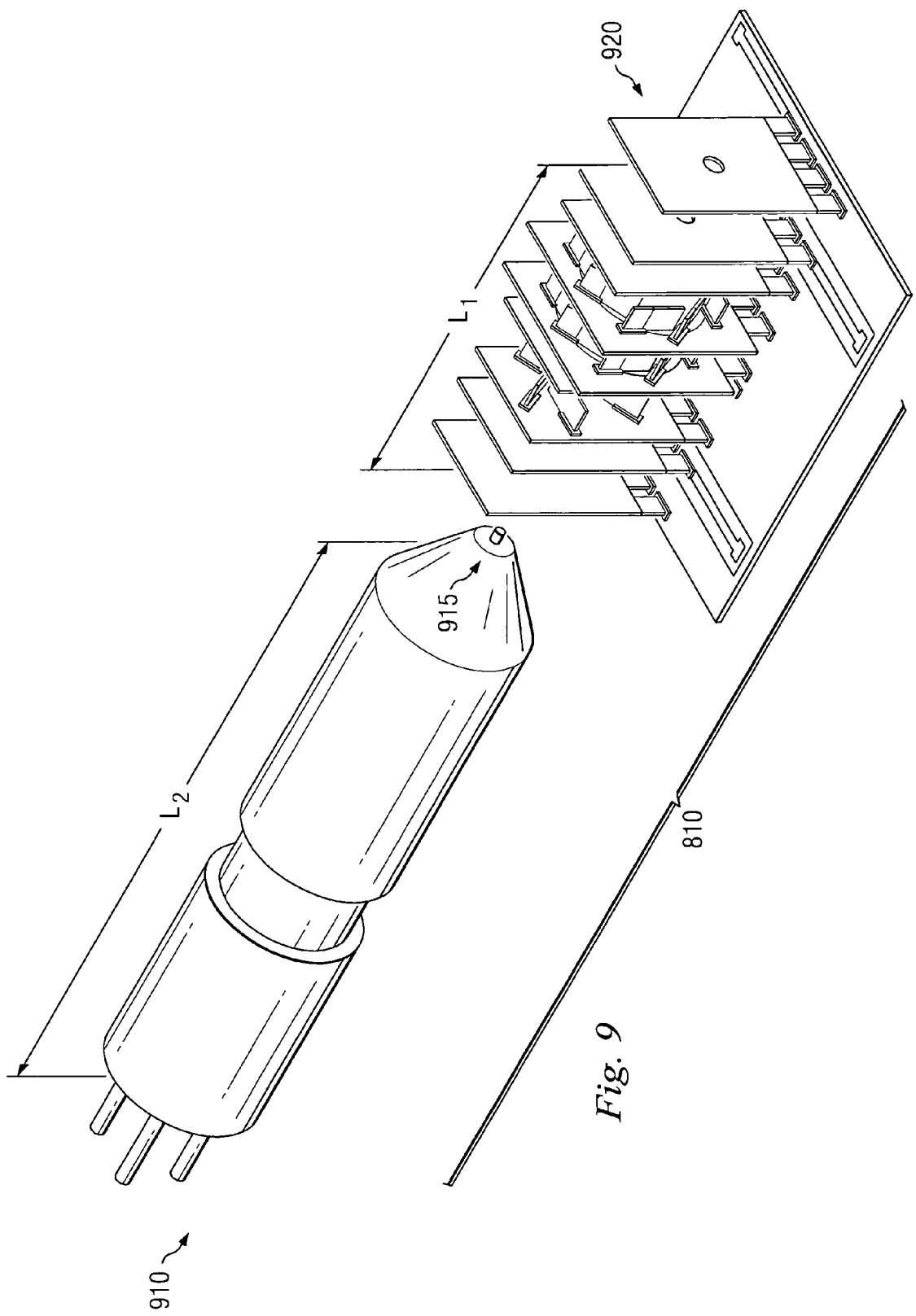
FIG. 9 illustrates a perspective view of a portion of the microcolumn system shown in FIG. 8.

Referring to FIG. 9, illustrated is one embodiment of at least a portion of the column 810 shown in FIG. 8. The column 810 includes an electron emitter 910 and a microcolumn 920. In one embodiment, the combination of the electron emitter 910 and the microcolumn 920, and possibly other components, may be a microcolumn system.

The microcolumn 920 maybe substantially similar to the microcolumn 100 shown in FIG. 1. The emitter 910 may be a thermionic electron gun, a field emission gun, or other type of electron emission device. In the illustrated embodiment, the emitter 910 has a length about equal to 2.5 times the length of the microcolumn 920. For example, the microcolumn 920 may have a length $L_1$ (measured between outside beam modification components) of about 10 mm or less, such that the emitter 910 may have a length $L_2$ of about 25 mm or less. However, in other embodiments the ratio of the length of the emitter 910 to the length of the microcolumn 920 may be less than about 2.5, including as low as about 1:1, or lower.

The emitter 910 may include an emitter tip 915 from which electrons are emitted in response to thermal energy (e.g., a Schottky source). However, a cold field emitter may also or alternatively be employed. In one embodiment, wafer/lithography processes (such as those described in reference to FIGS. 5A–5D) may be employed to fabricate the emitter 910/915 instead of employing the emitter 910 depicted in FIG. 9. For example, the emitter 910 may be fabricated from a substrate, as with the beam modification components described above, and may include a "tip" comprising carbon nanotubes, copper, tungsten, zirconium oxide, silicon, silicon oxide, titanium, and/or other materials, and assembled to the assembly substrate in front of other beam modification components. However, other conventional and/or future-developed types of emitters may also or alternatively be employed within the scope of the present disclosure.

Thus, the present disclosure provides a microcolumn including, in one embodiment, an assembly substrate and a plurality of beam modification components. The assembly substrate includes a plurality of sockets, and the beam modification components each include a connector coupled to a corresponding one of the sockets.

The present disclosure also introduces a clamp for supporting a MEMS component coupled to a MEMS substrate. The claim includes an extension member and first and second connectors. The first connector is coupled to a first end of the extension member and is configured to engage a socket on the MEMS substrate. The second connector is coupled to a second end of the extension member and is configured to engage a feature of the MEMS component.

A method of manufacturing a microcolumn column is also provided in the present disclosure. In one embodiment, the method includes providing a substrate having a device layer formed over an insulating layer. Portions of the device layer are removed to form: (1) an assembly substrate having a plurality of sockets and (2) a plurality of beam modification components each having a connector. The manufacturing method further includes releasing the beam modification components and assembling the beam modification components to the assembly substrate by coupling the connectors of the beam modification components to corresponding ones of the sockets. Assembly of the beam modification components may employ automation and/or automated calibration, including employing automated motion of robotic stages in a substantially automated manner.

The present disclosure also provides a microcolumn system including an electron gun and a microcolumn substantially aligned with the electron gun for modifying an electron beam produced by the electron gun. The microcolumn may include an assembly substrate having a plurality of sockets and a plurality of beam modification components each having a connector coupled to a corresponding one of the sockets.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microcolumn, comprising:
   an assembly substrate including a plurality of sockets; and
   a plurality of beam modification components each having a connector coupled to a corresponding one of the plurality of sockets.

2. The microcolumn of claim 1 wherein the plurality of beam modification components includes a beam focusing component.

3. The microcolumn of claim 1 wherein the plurality of beam modification components includes a beam spreading component.

4. The microcolumn of claim 1 wherein the plurality of beam modification components includes a beam steering component.

5. The microcolumn of claim 1 wherein the plurality of beam modification components includes a beam resizing component.

6. The microcolumn of claim 1 wherein the plurality of beam modification components includes an extractor component.

7. The microcolumn of claim 1 wherein the plurality of beam modification components includes an anode component.

8. The microcolumn of claim 1 wherein the plurality of beam modification components includes an octupole component.

9. The microcolumn of claim 1 wherein the plurality of beam modification components includes a quadrupole component.

10. The microcolumn of claim 1 wherein the plurality of beam modification components includes a blanker component.

11. The microcolumn of claim 1 wherein the plurality of beam modification components includes an aperture component.

12. The microcolumn of claim 1 wherein the plurality of beam modification components includes an Einzel lens component.

13. The microcolumn of claim 1 wherein one of the plurality of beam modification components includes a beam deflection component comprising:
   a component substrate having:
      a connector coupled to one of the plurality of sockets on the assembly substrate; and
      a plurality of component sockets formed in the component substrate; and
   a plurality of biasing members each having a biasing member connector coupled to a corresponding one of the plurality of component sockets.

14. The microcolumn of claim 1 wherein the plurality of beam modification components includes:
   an extractor component;
   a focusing electrode component offset from the extractor component in a direction;
   an anode component offset from the focusing electrode component in the direction;
   a multi-pole component offset from the anode component in the direction, the multi-pole component selected from the group consisting of an octupole component and a quadrupole component;
   an aperture component offset from the multi-pole component in the direction;
   a first deflector component offset from the aperture component in the direction;
   a second deflector component offset from the first deflector component in the direction; and
   a plurality of Einzel lens components each offset from the second deflector component in the direction.

15. The microcolumn of claim 1 wherein the plurality of beam modification components are each substantially perpendicular to the assembly substrate.

16. The microcolumn of claim 1 wherein the plurality of beam modification components are each substantially planar.

17. The microcolumn of claim 1 wherein the plurality of beam modification components and the assembly substrate are fabricated from common material layers formed over a handle substrate prior to assembly.

18. The microcolumn of claim 1 wherein the assembly substrate includes a plurality of traces and ones of the plurality of beam modification components include electrodes electrically coupled to corresponding ones of the plurality of traces.

19. The microcolumn of claim 1 wherein the connectors of ones of the plurality of beam modification members form electrical connections with corresponding ones of the plurality of sockets.

20. The microcolumn of claim 1 wherein the assembly substrate and ones of the plurality of beam modification components comprise doped silicon.

21. The microcolumn of claim 1 wherein the assembly substrate and ones of the plurality of beam modification components include electrical traces comprising a material selected from the group consisting of:
   gold; and
   platinum.

22. The microcolumn of claim 1 wherein the plurality of beam modification components collectively spans a distance of about 10 mm or less.

23. The microcolumn of claim 1 wherein each of the plurality of beam modification components have a thickness of about 50 µm.

24. The microcolumn of claim 1 wherein the plurality of beam modification components each have a footprint of less than about 2 cm$^2$.

25. The microcolumn of claim 1 wherein the plurality of beam modification components each have a footprint of about 1 cm$^2$.

26. The microcolumn of claim 1 further comprising a clamp including:
   an extension member;
   a first connector coupled to a first end of the extension member and engaged with one of the plurality of sockets on the assembly substrate; and
   a second connector coupled to a second end of the extension member and engaged with one of the plurality of beam modification components.

27. The microcolumn of claim 1 wherein the microcolumn is included in a system employed for electron beam lithography.

28. The microcolumn of claim 1 wherein the microcolumn is included in a system employed for mass spectroscopy.

29. The microcolumn of claim 1 wherein the microcolumn is included in a system employed for scanning electron microscopy (SEM).

30. A method of manufacturing a microcolumn, comprising:
   providing a substrate having a device layer formed over an insulating layer;
   removing portions of the device layer to form therein:
      an assembly substrate having a plurality of sockets; and
      a plurality of beam modification components each having a connector;
   releasing the plurality of beam modification components; and
   assembling the plurality of beam modification components to the assembly substrate by coupling the connectors of the plurality of beam modification components to corresponding ones of the plurality of sockets.

31. The method of claim 30 wherein assembling the plurality of beam modification components employs automation.

32. The method of claim 30 wherein assembling the plurality of beam modification components employs automated calibration.

33. The method of claim 30 wherein assembling the plurality of beam modification components employs automated motion of robotic stages in a substantially automated manner.

34. A microcolumn system, comprising:
an electron gun; and
a microcolumn substantially aligned with the electron gun for modifying an electron beam produced by the electron gun, the microcolumn including:
  an assembly substrate including a plurality of sockets; and
  a plurality of beam modification components each having a connector coupled to a corresponding one of the plurality of sockets.

35. The system of claim 34 further comprising a specimen chamber for housing a specimen to be examined by the system, the specimen chamber including a detector for detecting attributes of the specimen based on interaction between the electron beam and the specimen.

36. The system of claim 34 wherein the attributes of the specimen include geometric dimensions of a feature of the specimen.

37. The system of claim 34 wherein the attributes of the specimen include a composition of at least a portion of the specimen.

38. The system of claim 34 wherein the system is employable for electron beam lithography.

39. The system of claim 34 wherein the system is employable for mass spectroscopy.

40. The system of claim 34 wherein the system is employable for scanning electron microscopy.

* * * * *